US006677831B1

(12) United States Patent
Cheng et al.

(10) Patent No.: US 6,677,831 B1
(45) Date of Patent: Jan. 13, 2004

(54) DIFFERENTIAL IMPEDANCE CONTROL ON PRINTED CIRCUIT

(75) Inventors: Christopher Cheng, Los Gatos, CA (US); Josh Price, Livermore, CA (US)

(73) Assignee: 3PARdata, Inc., Fremont, CA (US)

( * ) Notice: Subject to any disclaimer, the term of this patent is extended or adjusted under 35 U.S.C. 154(b) by 42 days.

(21) Appl. No.: 09/773,111

(22) Filed: Jan. 31, 2001

(51) Int. Cl.$^7$ ................................................. H01P 5/02
(52) U.S. Cl. .............................. 333/34; 333/4; 333/236
(58) Field of Search ......................... 333/4, 5, 34, 236, 333/245, 246

(56) References Cited

U.S. PATENT DOCUMENTS

| 4,593,243 A | * | 6/1986 | Lao et al. ..................... 333/34 |
| 5,138,287 A | * | 8/1992 | Domokos et al. ........... 333/245 |
| 2002/0079983 A1 | * | 6/2002 | Leddige et al. ................ 333/34 |

OTHER PUBLICATIONS

Mears, James, "A Different Look at Differential Impedance," Feb. 23, 1999, National Semiconductor Corporation.
Mears, James A., "Transmission Line RAPIDESIGNER© Operation and Applications Guide," National Semiconductor Application Note 905, May 1996.

Douglas Brooks, "Differential Impedance—What's the Difference?", Printed Circuit Design, a Miller Freeman Publication, Aug. 1998, 2 pages.
Douglas Brooks, "PCB Impedance Control—Formulas and Resources", Printed Circuit Design Magazine, Mar. 1998, 4 pages.
Douglas Brooks, "Differential Signals—Rules to Live By", Printed Circuit Design, a CMP Media Publication, Oct. 2001, 4 pages.
"Direct Rambus™ Short Channel Layout Guide", Version 0.9, Rambus Inc. paper, pp 1–34. Copyright Aug. 2001.

* cited by examiner

*Primary Examiner*—Benny Lee
(74) *Attorney, Agent, or Firm*—Patent Law Group LLP; David C. Hsia (57) ABSTRACT

A new method to control differential signal trace impedance allows flexible use of different signal trace width and spacing while maintaining constant differential impedance in printed circuit boards. Differential impedance of a signal pair is determined by the geometry of individual traces and the spacing between traces. The value of the differential impedance is inversely proportional to signal trace width and directly proportional to signal trace spacing. By decreasing or increasing trace width and spacing simultaneously, a constant differential impedance can be achieved.

34 Claims, 4 Drawing Sheets

DIFFERENTIAL IMPEDANCE CONTROL ON PRINTED CIRCUIT

BACKGROUND OF THE INVENTION

1. Field of the Invention

This invention relates to printed circuit cards and usage of variable width signal traces and spacing to maintain constant differential impedance.

2. Description of Related Art

Traditional printed circuit board (PCB) design uses a fixed trace width for signal routing. For any given signal trace width, fixed spacing is required between a differential pair to achieve a constant differential impedance. The fixed trace width is limited by the spacing between pins and must remain constant even after the signal trace leaves the package pin field.

Modern high speed communication interconnects often use differential signals to transmit signals over long distances. Differential signals reference each other rather than a reference plane voltage, such as a ground plane voltage. The differential signals can be transmitted across a long distance without a common ground reference between the source and destination system. A source system delivers a pair of signals which, ideally, are exact opposite states. At the receiving end, the difference between the two signals is evaluated and the correct state of the signal is determined. The amplitude of the signal transmitted is determined by the differential impedance of the interconnect. For a fixed amount of driver current, the higher the differential impedance, the larger the signal swing which is desirable for signal communication.

Figure 1A:
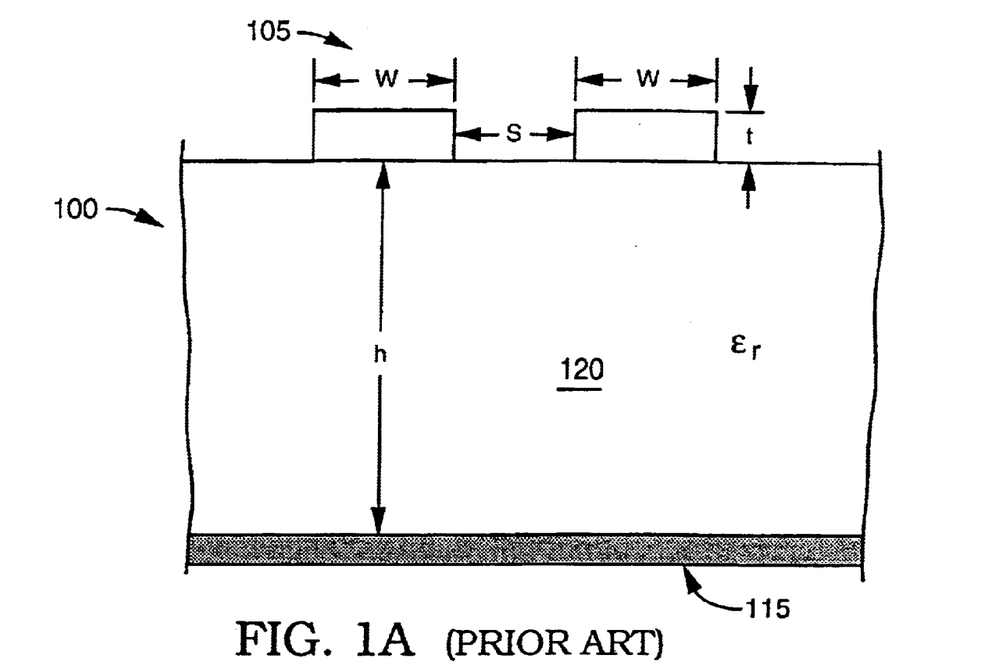
FIG. 1A is a cross-sectional view that illustrates a conventional microstrip in a printed circuit board.
Figure 1B:
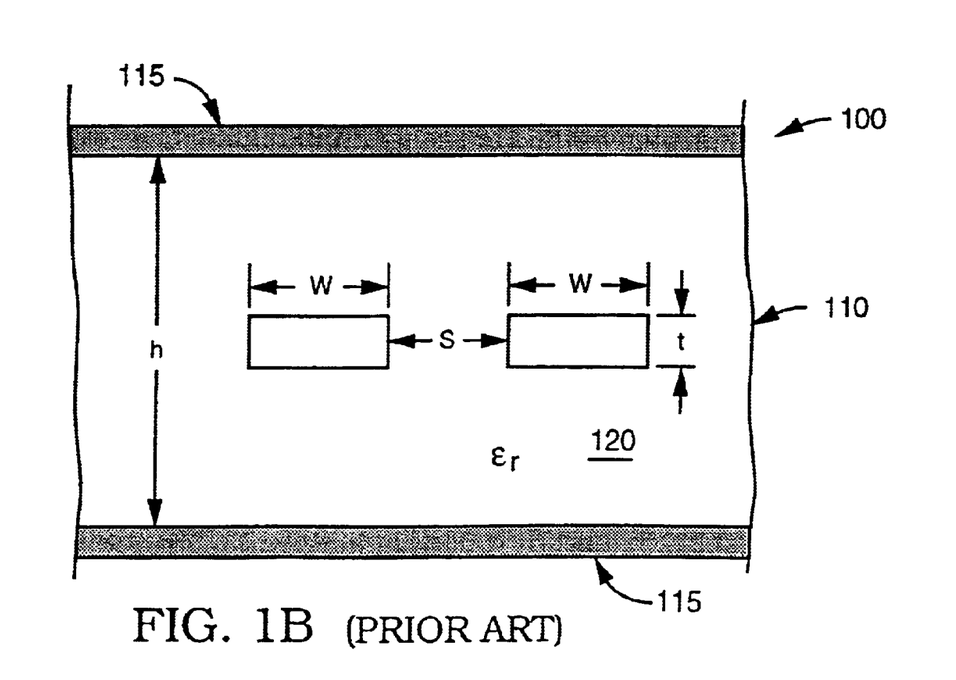
FIG. 1B is a cross-sectional view that illustrates a conventional stripline in a printed circuit board.

FIGS. 1A and 1B are cross-sectional views of a conventional microstrip and a conventional stripline, respectively, in a PCB 100. The PCB has a dielectric or insulator material 120 with a thickness h. Transmission lines on PCBs 100 can have two or more conducting paths: two conductors (also known as traces) and/or a conducting plane in close proximity to a conductor. The conductors can be in the form of a microstrip transmission line 105 (see FIG. 1A) or a stripline 110 (see FIG. 1B). Hereafter, "microstrip transmission line" is simply referred to as "microstrip" for convenience. Both types of conductors have reference image planes, sometimes called virtual-ground planes, which may be either circuit ground or power planes 115. As seen in FIG. 1A, a microstrip 105 has a surface conductor separated from a reference plane 115 by the dielectric material 120. As seen in FIG. 1B, a stripline conductor 110 is embedded in the dielectric and located, centered or otherwise, between two conducting reference planes 115.

In both FIGS. 1A and 1B, the conductor width w specifies the width of each trace. Conductor thickness t specifies the thickness of each signal trace and conductor spacing s specifies the distance between the inner edges of each trace. The dielectric thickness h specifies the thickness of the dielectric measured from the PCB reference groundplane 115 to the bottom of the trace.

The dielectric layer in these structures is described by a dielectric constant $\in_r$ relative to that of free space. The dielectric constant of free space is equal to one ($\in_r=1$). The dielectric constant for a microstrip is a combination of the dielectric constants of air above the lines and the board insulator material 120 below the lines. The effective dielectric constant for a microstrip is equal to the dielectric constant of the base material. The effective dielectric constant for a stripline is determined by the dielectric 120 embedding the conductor.

Differential transmission lines are made of two strip conductors spaced closely and forming a complete conducting loop path for the signal. A conducting plane is not needed to form a complete transmission path.

A need exists for signal traces to maintain constant differential impedance while allowing the signal traces to escape tight package pin pitch and maintain relatively low DC loss.

SUMMARY OF THE INVENTION

Flexible use of different signal trace widths and spacings controls differential signal trace impedance on PCBs. Differential impedance of a signal pair is determined by the geometry and spacing of individual traces. The value of the differential impedance is inversely proportional to the width and directly proportional to the spacing of the traces. By decreasing or increasing the trace width and spacing simultaneously, a constant differential impedance can be achieved. Methods and apparatus for microstrips and striplines are directed to using variable width signal traces and spacing to maintain constant differential impedance while allowing signal traces to escape tight package pin pitch and maintain relatively low DC loss.

In accordance with an embodiment of the invention, a method of controlling differential impedance using variable trace width and spacing includes selecting a differential impedance to be maintained on the circuit; constructing a constant differential impedance plot based on an impedance model, signal trace width and signal trace spacing; selecting a maximum signal trace width and spacing from the plot for a package pin field; and selecting a signal trace width and spacing from the plot for an area outside the package pin field such that differential impedance remains constant.

In accordance with an embodiment of the invention, an apparatus for maintaining constant differential impedance on a circuit includes a printed circuit board with a dielectric material of a constant thickness; at least one package pin field on the printed circuit board; and a microstrip including a pair of conductors of constant thickness on the printed circuit board wherein differential impedance along the length of the pair is constant.

In accordance with an embodiment of the invention, an apparatus for maintaining constant differential impedance on a printed circuit board includes a printed circuit board with a dielectric material of a constant thickness; at least one package pin field on the printed circuit board; and a stripline including a pair of conductors of constant thickness inside the printed circuit board wherein differential impedance along the length of the pair is constant.

This invention will be more fully understood in light of the following detailed description taken together with the accompanying drawings.

BRIEF DESCRIPTION OF THE DRAWINGS

Use of the same reference symbols in different figures indicates similar or identical items.

DETAILED DESCRIPTION OF THE PREFERRED EMBODIMENTS

Constant differential impedance is desirable in multi-layer PCBs 100. Although PCBs 100 use a number of different dielectric materials 120, constant differential impedance may be maintained on a PCB 100 regardless of the dielectric material 120 used in the PCB 100. Each dielectric material 120 has its own dielectric constant $\in_r$. Dielectric constants $\in_r$ for dielectric material 120 in a PCB 100 mnay range from 2 to 10. These dielectric materials include, without limitation, TEFLON ($\in_r$=2.1), polyimide ($\in_r$=3.5), PTFE ($\in_r$=3.9), FR4 ($\in_r$=4.5), glass ceramic ($\in_r$=5.0), and alumina ($\in_r$=9.4). The thickness of a dielectric material 120 in a PCB 100, used in conjunction with a microstrip 305. (see FIG. 3A), ranges from 4 to 15 mils. The thickness of a dielectric material 120 in a PCB 100, used in conjunction with a stripline 310 (see FIG. 3B), ranges from 4 to 40 mils.

In an example of an impedance model, differential impedance $Z_D$ can be calculated from the well-known equation (1):

$$Z_D = 2Z_O(1-K_B) \text{ where} \tag{1}$$

$Z_D$=differential impedance of signal pair $Z_O$=intrinsic impedance of individual signal $K_B$=backward crosstalk factor Intrinsic impedance can be approximated by the well-known equations (2) and (3):

For microstrips:

$$Z_O = 87 \ln(5.98h/(0.8w+t))/\text{sqrt}(\in_r+1.41) \tag{2}$$

For striplines (assuming the stripline is located approximately at half the dielectric thickness h):

$$Z_O = 60 \ln(1.9(2h+t)/(0.8w+t))/\text{sqrt}(\in_r) \tag{3}$$

Backward crosstalk factor can be approximated by well-known equations (4) and (5):

For microstrips:

$$K_B = 0.24 e^{-0.9s/h} \tag{4}$$

For striplines (assuming the stripline is located approximately at half the dielectric thickness h):

$$K_B = 0.187 e^{-2.9s/h} \tag{5}$$

Equations (1)–(5) are predicated on the basis that there is constant PCB/dielectric thickness.

In general, decreasing the trace width w increases the intrinsic impedance $Z_O$. Decreasing the spacing between signal traces increases the cross-talk factor $K_B$ and therefore decreases the differential impedance. A specific differential impedance can be achieved by adjusting the width and spacing between the signal traces.

An additional factor that is considered in signal transmission is copper loss which is a measure of signal degradation due to resistive drop along the signal trace. One way of estimating copper loss is based on the DC resistance of the signal trace which can be calculated by the well-known equation (6):

$$\text{DC resistance per unit length} = \rho/(w*t) \text{ where} \tag{6}$$

$\rho$=resistivity of the material used to construct the signal trace.

From equation (6) for DC resistance per unit length, a trace with a greater width w reduces the signal loss during transmission. However, in real world PCB design, the widest usable signal trace and spacing is controlled by the tight package spacing between signal pins in a package field 130. The above constraints conflict since tight package pin spacing requires smaller trace width w. Trace width w is preferably widened to decrease signal loss.

The following procedure was developed to reduce signal loss while maintaining a constant differential impedance. A desirable differential impedance is selected based on the driver and receiver technology, usually in the range of 100–150 ohms. Once the desirable differential impedance is selected, the user chooses whether to use either a microstrip 305 or a stripline 310. On the basis of the choice between using microstrip 305 or stripline 310, appropriate equations stated above or other suitable equations are used to construct a constant differential impedance plot. Parameters varied include signal trace width w, trace spacing s, and trace thickness t. Dielectric thickness h is held constant.

Figure 2A:
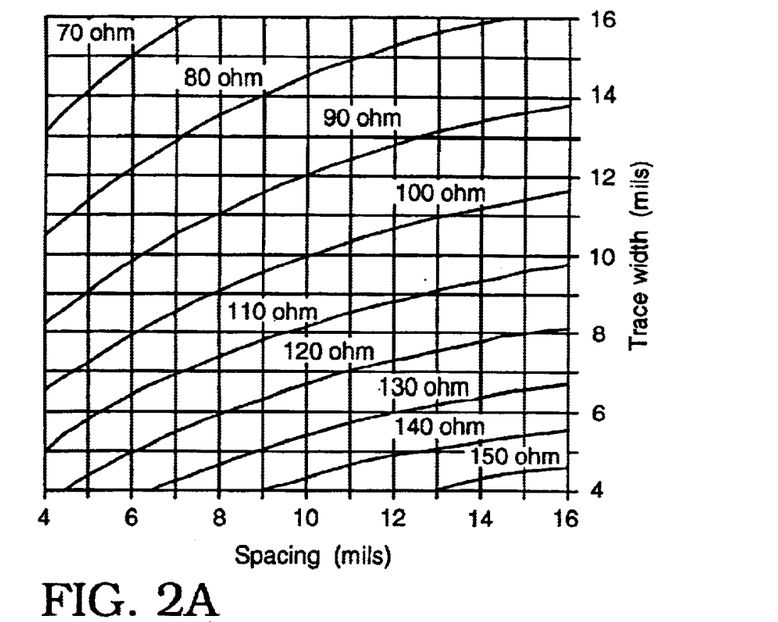
FIG. 2A is a graph that illustrates various constant differential impedances of microstrips based on constant PCB board thickness, varying trace width and varying trace spacing.
Figure 2B:
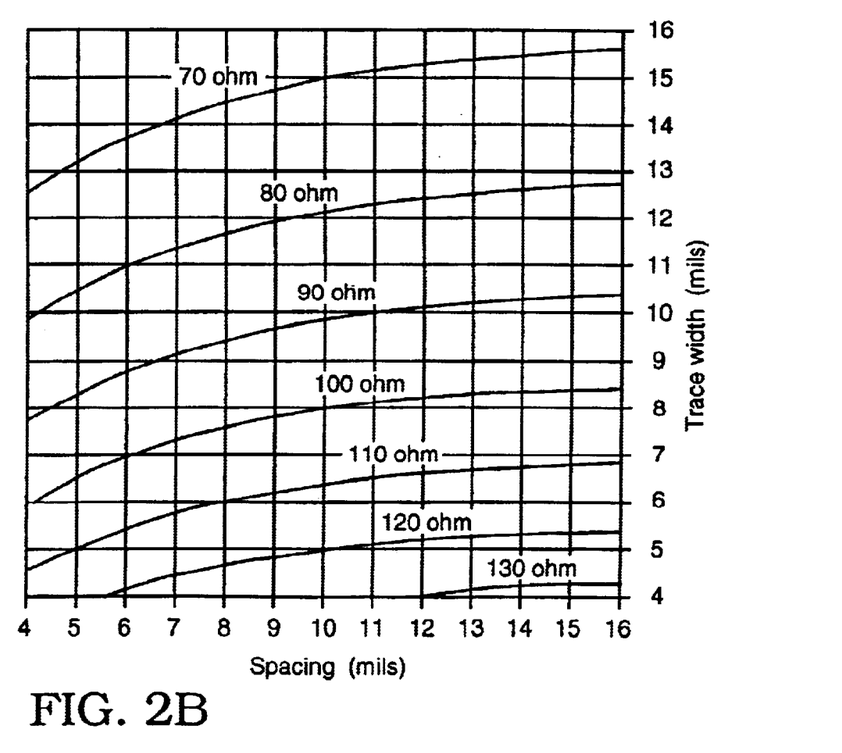
FIG. 2B is a graph that illustrates various constant differential impedances of striplines based on constant PCB board thickness, varying trace width and varying trace spacing.

FIG. 2A shows a plot created using equations (1), (2), (4), and (6) for the differential impedance of microstrips 305 based on a constant PCB board dielectric thickness h of 8 mils, trace thickness t of 1.4 mil, varying trace width w of 4 to 16 mils, and varying trace spacing s of 4 to 16 mils. FIG. 2B shows a plot created by from the above equations (1), (3), (5), and (6) for the differential impedance of striplines 310 based on a constant PCB board dielectric thickness h of 24 mils, trace thickness t of 1.4 mil, varying trace width w of 4 to 16 mils, and varying trace spacing s of 4 to 16 mils.

Figure 3A:
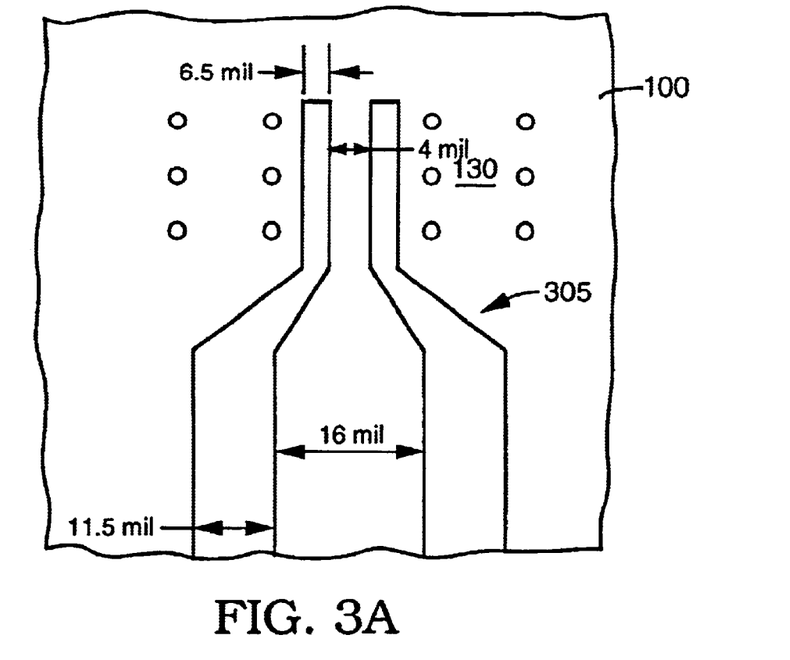
FIG. 3A is a plan view that illustrates an embodiment of a microstrip of the claimed invention based on the plot of FIG. 2A.
Figure 3B:
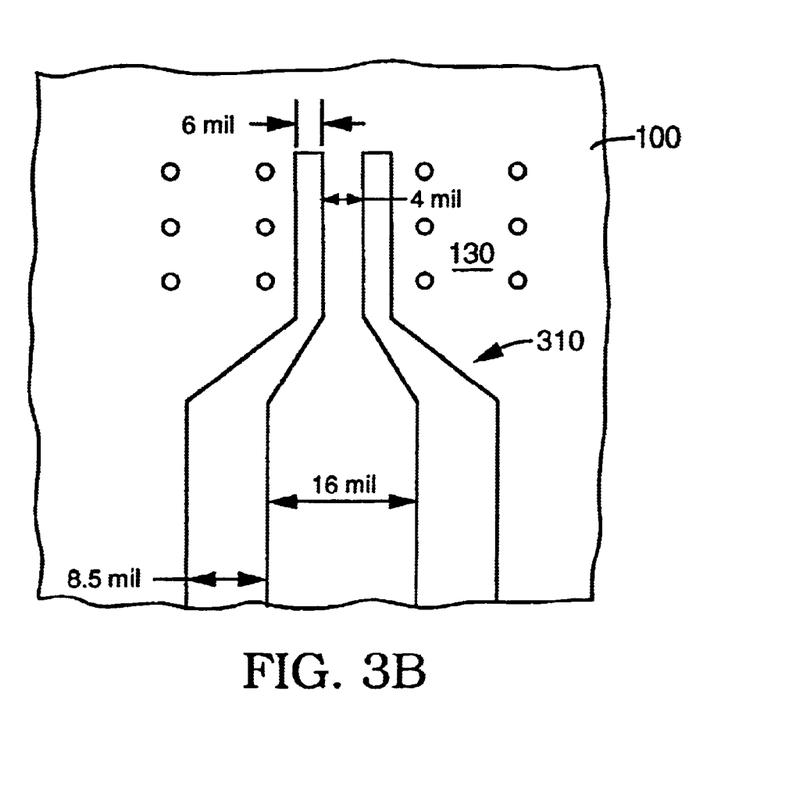
FIG. 3B is a plan view that illustrates an embodiment of a stripline of the claimed invention based on the plot of FIG. 2B.

The maximum desirable trace pitch and spacing for passing out of the package to pin pitch is selected from the curve representing the desired constant differential impedance. The widest desirable signal trace that can fit the remaining PCB routing channels is also selected from the curve to maintain constant differential impedance. As seen in FIGS. 3A and 3B, the signal pair exits package pin area 130 using the finer pitch width and spacing and expands to a maximum desirable trace width and spacing where the signal pair passes through package pin field 130.

Based on the example in FIG. 2A, a constant differential impedance of 100 ohm can be achieved for a microstrip 305 in a PCB 100 with a dielectric thickness T. The package pin field 130 limits the maximum trace pitch and spacing that can exit the package pin pitch to a microstrip conductor width w of 6.5 mil. The spacing of the trace is 4 mil. Based on FIG. 2A, the maximum desirable trace width and spacing at a constant differential impedance of 100 ohms is a trace width of 11.5 mil traces and 16 mil spacing as shown in FIG. 3A. Microstrip 305 expands to this width and spacing where the signal pair passes through package pin field 130. Using this method, narrow traces with tight spacing are used to exit signals through tight pin pitch package 130 while maintaining constant differential impedance. For signal traces in a less congested area of PCB 100 than pin package field 130, the traces widen and increase in spacing to minimize copper loss.

In accordance with an embodiment of the invention, FIG. 3A illustrates an example of maintaining constant 100 ohm differential impedance using variable microstrip trace widths w and spacing s based on the plot of FIG. 2A. An effective package pitch of 16 mils + tolerance can be supported while copper losses are decreased by 30% by using 11.5 mil traces in the open area outside the package pin field 130. Based on the curve for a selected 100 ohm constant differential impedance, as seen in impedance plot FIG. 2A, the maximum trace pitch and spacing that exit package pin pitch 130 is a trace width w of 6.5 mils and a trace spacing s of 4 mils. The curve is examined to determine the widest desirable signal trace that fits the remainder of the PCB routing channel. The widest desirable signal trace width w is 11.5 mils with a trace spacing s of 16 mils. The signal pair escapes package pin area 130 using the finer pitch width and spacing and expands to maximum desirable trace width w and spacing s as soon as the signal pair pass through package pin field 130.

Based on the example shown in FIG. 2B, a constant differential impedance of 100 ohm can be achieved for a stripline 310 in a PCB 100 with a dielectric thickness T. Package pin field 130 limits the maximum trace width w and spacing s that can exit the package pin pitch to a stripline conductor width of 6 mil traces. The spacing of the trace is 4 mil. Based on FIG. 2B, the maximum desirable. trace width and spacing at a constant differential impedance of 100 ohms is a trace width w of 8.5 mil and trace spacing s of 16 mil as shown in FIG. 3B. Using this method, narrow traces with tight spacing are used to exit signals through tight pin pitch package 130 while maintaining constant differential impedance. For signal traces in a less congested area than pin package field 130, the traces widen and increase in spacing to minimize copper loss.

In accordance with an embodiment of the invention, FIG. 3B illustrates an example of maintaining constant 100 ohm differential impedance using variable stripline trace widths w and spacing s. An effective package pitch of 16 mils + tolerance can be supported while copper losses are decreased by 30% by using 8.5 mil traces in the open area. Based on the curve for a selected 100 ohm constant differential, as seen in impedance plot FIG. 2B, the maximum trace pitch and spacing that exit package pin pitch area 130 is a trace width w of 6 mils and a trace spacing s of 4 mils. The curve is examined to determine the widest desirable signal trace that can fit the remainder of the PCB routing channel. The widest desirable signal trace width w is 8.5 mils with a trace spacing s of 16 mils. The signal pair exits package pin area 130 using the finer pitch width and spacing and expands to maximum trace width and spacing where the traces pass through package pin field 130.

Figure 4:
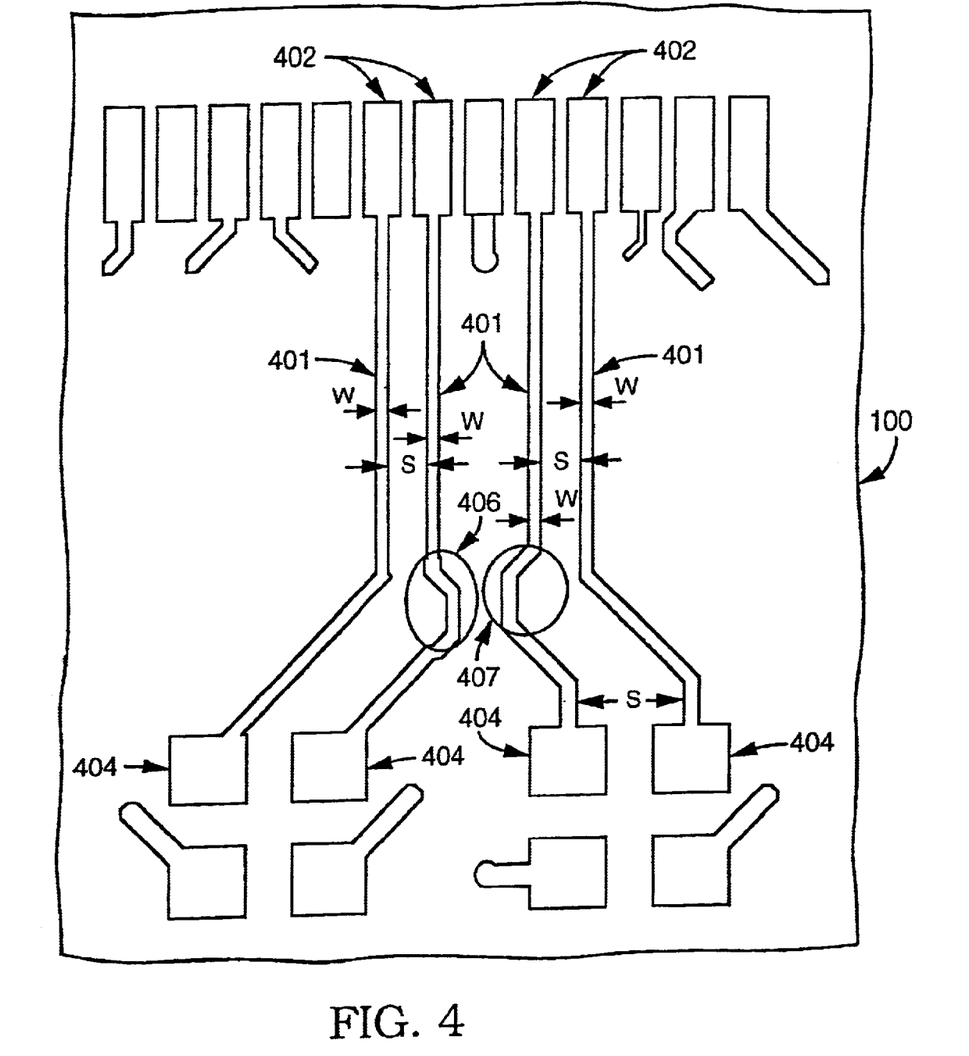
FIG. 4 is a plan view of a layout of a PCB that illustrates an embodiment of signal traces of the claimed invention.

In accordance with an embodiment of the invention, FIG. 4 illustrates an example of an embodiment of microstrip signal traces of the claimed invention on a section of a layer of PCB 100. A plurality of microstrip signal traces 401 run between chip pin contact pads 402 for a fiber channel differential signal chip (not shown) and signal terminator contact pads 404 for a signal terminator (not shown). It is known in the art that a fiber channel signal chip runs between computer and a disk drive. It is also known in the art that a signal terminator is at the end of the signal path of a differential signal. Two pairs of microstrip signal traces exit from contact pads 402 towards signal terminator contact pads 404. In each pair of microstrips 401, the two signal traces maintain constant differential impedance with respect to each other substantially along their length between chip pin contact pads 402 and signal terminator contact pads 404; width w and spacing s of each signal trace substantially in accordance with equations (1), (2), (4), and (6), as stated above. In ideal conditions, microstrip signal traces adhere to equations (1), (2), (4), and (6) in terms of width w and spacing s along the length of microstrip 401. However, in 'real world' PCB design, spacing constraints on the PCB sometimes require that various chip components be placed in certain positions on other layers of the PCB. The placement of these chip components may interfere in routing signal traces along ideal paths where constant differential impedance may be maintained from one end of a pair of signal traces to the other. The placement of these chip components may result in portions of signal trace sections 406, 407 being routed around or away from the chip component (not shown). In certain instances, deviation of a signal trace due to the presence of a chip component may be so short (e.g. less than half an inch) as to be insignificant. However, for deviations half an inch or greater in sections 406, 407, differential impedance may vary significantly between signal traces. Where the deviation is half an inch or greater, width w of each signal trace section 406, 407 may be adjusted, according to equations (1), (2), (4), and (6) to maintain constant differential impedance in the portions of microstrip 401 prior to and after sections 406, 407. In the portions of microstrip 401 prior to and after sections 406, 407, constant differential impedance is maintained according to equations (1), (2), (4), and (6), as stated above. The preceding is likewise applicable to routing of striplines.

The above-described embodiments of the present invention are merely meant to be illustrative and not limiting. It will thus be obvious to those having ordinary skill in the art that various changes and modifications may be made without departing from this invention in its broader aspects. Therefore, the appended claims encompass all such changes and modifications as falling within the true spirit and scope of this invention.

We claim:

1. A method of controlling differential impedance in a circuit including variable trace width and spacing comprising:

selecting a differential impedance to be maintained on the circuit;

constructing a constant differential impedance plot based on an impedance model, signal trace width and signal trace spacing;

selecting, from the constant differential impedance plot, a maximum signal trace width and spacing for a package pin field;

selecting, from the constant differential impedance plot, a signal trace width and spacing for an area outside the package pin field such that the differential impedance remains constant;

selecting a signal trace that expands from the maximum signal trace width and spacing for the package pin field to the signal trace width and spacing for the area outside the package pin field such that the differential impedance remains constant; and wherein the signal trace width and spacing is expanded from the maximum signal trace width and spacing for the package pin field to the signal trace width and spacing for the area outside the package pin field as soon as the signal trace exits the package pin field.

2. A method of controlling differential impedance in a circuit including variable trace width and spacing comprising:

selecting a differential impedance to be maintained on the circuit;

constructing a constant differential impedance plot based on an impedance model, signal trace width and signal trace spacing;

selecting, from the constant differential impedance plot, a maximum signal trace width and spacing for a package pin field; and selecting, from the constant differential impedance plot, a signal trace width and spacing for an area outside the package pin field such that the differential impedance remains constant.

3. The method of claim 2, comprising:

selecting a signal trace that expands from the maximum signal trace width and spacing for the package pin field to the signal trace width and spacing for the area outside the package pin field such that the differential impedance remains constant.

4. The method of claim 2, wherein the circuit is part of a printed circuit board.

5. The method of claim 2, wherein the construction of the constant differential impedance plot is further based on a dielectric material with a fixed dielectric thickness.

6. The method of claim 5, wherein the dielectric constant of the dielectric material ranges from 2 to 10.

7. The method of claim 5, wherein the fixed thickness of the dielectric material used in conjunction with a microstrip ranges from 4 to 15 mils.

8. The method of claim 5, wherein the fixed thickness of the dielectric material used in conjunction with a stripline ranges from 4 to 40 mils.

9. A method of controlling differential impedance in a circuit including variable trace width and spacing comprising:

selecting a differential impedance to be maintained in the circuit;

selecting a printed circuit board with a dielectric material of a constant thickness;

determining the dielectric constant of the dielectric material;

determining spacing between pins in a package pin field on the printed circuit board;

determining spacing available for signal trace routing outside the package pin field;

selecting a signal trace pair from the group consisting of a microstrip and a stripline;

calculating a constant differential impedance plot from an impedance model;

selecting, from the constant differential impedance plot, a maximum signal trace width and, spacing for a package pin field;

selecting, from the constant differential impedance plot, a signal trace width and spacing for an area outside the package pin field such that the differential impedance remains constant;

expanding the signal trace width and spacing from the maximum signal trace width and spacing for a package pin field to the signal trace width and spacing for the area outside the package pin field such that the differential impedance remains constant; and wherein the signal trace width and spacing is expanded from the maximum signal trace width and spacing for a package pin field to the signal trace width and spacing for an area outside the package pin field as soon as the signal trace exits the package pin field such that the differential impedance remains constant.

10. A method of controlling differential impedance in a circuit including variable trace width and spacing comprising:

selecting a differential impedance to be maintained in the circuit;

selecting a printed circuit board with a dielectric material of a constant thickness;

determining the dielectric constant of the dielectric material;

determining spacing between pins in a package pin field on the printed circuit board;

determining spacing available for signal trace routing outside the package pin field;

selecting a signal trace pair from the group consisting of a microstrip and a stripline;

calculating a constant differential impedance plot from an impedance model;

selecting, from the constant differential impedance plot, a maximum signal trace width and spacing for a package pin field; and selecting, from the constant differential impedance plot, a signal trace width and spacing for an area outside the package pin field such that the differential impedance remains constant.

11. The method of claim 10, further comprising:

expanding the signal trace width and spacing from the maximum signal trace width and spacing for a package pin field to the signal trace width and spacing for the area outside the package pin field such that the differential impedance remains constant.

12. The method of claim 10, wherein the dielectric constant ranges from 2 to 10.

13. The method of claim 10, wherein the constant thickness of the dielectric material used in conjunction with the microstrip ranges from 4 to 15 mils.

14. The method of claim 10, wherein the constant thickness of the dielectric material used in conjunction with the stripline ranges from 4 to 40 mils.

15. An apparatus for maintaining constant differential impedance on a circuit, comprising:

a printed circuit board with a dielectric material of a constant thickness;

at least one package pin field on the printed circuit board; and a microstrip including a pair of conductors of constant thickness on the printed circuit board wherein differential impedance along the length of the pair is constant.

16. The apparatus of claim 15, wherein both the width of each conductor and the spacing between the pair of conductors vary along the respective length of the pair.

17. The method of claim 15, wherein the constant thickness of the dielectric material used in conjunction with the microstrip ranges from 4 to 15 mils.

18. The method of claim 15, wherein a dielectric constant of the dielectric material ranges from 2 to 10.

19. An apparatus for maintaining constant differential impedance on a circuit, comprising:

a printed circuit board with a dielectric material of a constant thickness;

at least one package pin field on the printed circuit board;

a microstrip including a pair of conductors of constant thickness on the printed circuit board; and wherein:

the differential impedance along the length of the pair is constant; and both the width of each conductor and the spacing between the pair of conductors inside the package pin field are smaller than the width of each conductor and the spacing between the pair of conductors outside the package pin field, respectively.

20. An apparatus for maintaining constant differential impedance on a printed circuit board, comprising:
   a printed circuit board with a dielectric material of a constant thickness;
   at least one package pin field on the printed circuit board; and
   a stripline including a pair of conductors of constant thickness inside the printed circuit board wherein differential impedance along the length of the pair is constant.

21. The apparatus of claim 20, wherein both the width of each conductor and the spacing between the pair of conductors varies along the respective length of the pair.

22. The apparatus of claim 20, wherein the constant thickness of the dielectric material used in conjunction with the stripline ranges from 4 to 40 mils.

23. The apparatus of claim 20, wherein a dielectric constant of the dielectric material ranges from 2 to 10.

24. An apparatus for maintaining constant differential impedance on a printed circuit board, comprising:
   a printed circuit board with a dielectric material of a constant thickness;
   at least one package pin field on the printed circuit board;
   a stripline including a pair of conductors of constant thickness inside the printed circuit board wherein differential impedance along the length of the pair is constant; and
   wherein the width of each conductor and the spacing between the pair of conductors inside the package pin field is smaller than the width of each conductor and the spacing between the pair of conductors outside the package pin field, respectively.

25. A microstrip of constant differential impedance along its the length thereof formed by the process comprising:
   selecting a differential impedance;
   selecting a printed circuit board with a dielectric material of a constant thickness;
   determining the dielectric constant of the dielectric material;
   determining spacing between pins in a package pin field on the printed circuit board;
   determining spacing available for signal trace routing outside the package pin field;
   calculating a constant differential impedance plot;
   selecting, from the constant differential impedance plot, a maximum signal trace width and spacing for a package pin field; and
   selecting, from the constant differential impedance plot, a signal trace width and spacing for an area outside the package pin field such that the differential impedance remains constant.

26. The microstrip of claim 25, further comprising:
   expanding the signal trace width and spacing from the maximum signal trace width and spacing for a package pin field to the signal trace width and spacing for the area outside the package pin field such that the differential impedance remains constant.

27. The microstrip of claim 25, wherein the constant thickness of the dielectric material ranges from 4 to 15 mils.

28. The microstrip of claim 25, wherein the dielectric constant ranges from 2 to 10.

29. A microstrip of constant differential impedance along the length thereof formed by the process comprising:
   selecting a differential impedance;
   selecting a printed circuit board with a dielectric material of a constant thickness;
   determining the dielectric constant of the dielectric material;
   determining spacing between pins in a package pin field on the printed circuit board;
   determining spacing available for signal trace routing outside the package pin field;
   calculating a constant differential impedance plot;
   selecting, from the constant differential impedance plot, a maximum signal trace width and spacing for a package pin field;
   selecting, from the constant differential impedance plot, a signal trace width and spacing for an area outside the package pin field such that the differential impedance remains constant;
   expanding the signal trace width and spacing from the maximum signal trace width and spacing for a package pin field to the signal trace width and spacing for the area outside the package pin field such that the differential impedance remains constant; and
   wherein the signal trace width and spacing is expanded from the maximum signal trace width and spacing for a package pin field to the signal trace width and spacing for the area outside the package pin field as soon as the signal trace exits the package pin field such that the differential impedance remains constant.

30. A stripline of constant differential impedance along its the length thereof formed by the process comprising:
   selecting a differential impedance;
   selecting a printed circuit board with a dielectric material of a constant thickness;
   determining the dielectric constant of the dielectric material;
   determining spacing between pins in a package pin field on the printed circuit board;
   determining spacing available for signal trace routing outside the package pin field;
   calculating a constant differential impedance plot;
   selecting, from the constant differential impedance plot, a maximum signal trace width and spacing for a package pin field; and
   selecting, from the constant differential impedance plot, a signal trace width and spacing for an area outside the package pin field such that the differential impedance remains constant.

31. The stripline of claim 30, further comprising:
   expanding the signal trace width and spacing from the maximum signal trace width and spacing for a package pin field to the signal trace width and spacing for the area outside the package pin field such that the differential impedance remains constant.

32. The stripline of claim 30, wherein the constant thickness of the dielectric material ranges from 4 to 40 mils.

33. The stripline of claim 30, wherein the dielectric constant ranges from 2 to 10.

34. A stripline of constant differential impedance along the length thereof formed by the process comprising:

selecting a differential impedance;

selecting a printed circuit board with a dielectric material of a constant thickness;

determining the dielectric constant of the dielectric material;

determining spacing between pins in a package pin field on the printed circuit board;

determining spacing available for signal trace routing outside the package pin field;

calculating a constant differential impedance plot;

selecting, from the constant differential impedance plot, a maximum signal trace width and spacing for a package pin field;

selecting, from the constant differential impedance plot, a signal trace width and spacing for an area outside the package pin field such that the differential impedance remains constant;

expanding the signal trace width and spacing from the maximum signal trace width and spacing for a package pin field to the signal trace width and spacing for the area outside the package pin field such that the differential impedance remains constant; and wherein the signal trace width and spacing is expanded from the maximum signal trace width and spacing for a package pin field to the signal trace width and spacing for the area outside the package pin field as soon as the signal trace exits the package pin field such that the differential impedance remains constant.

* * * * *